US012604438B2

(12) United States Patent
Kalantarian et al.

(10) Patent No.: US 12,604,438 B2
(45) Date of Patent: Apr. 14, 2026

(54) MODULE WITH IMPROVED THERMAL COOLING PERFORMANCE

(71) Applicant: Intel Corporation, Santa Clara, CA (US)

(72) Inventors: Ali Kalantarian, Richmond Hill (CA); Malcolm Gutenburg, Vancouver (CA); Andrew Randell, Waterloo (CA); Mirui Wang, Oshawa (CA); Tejas Shah, Austin, TX (US); Tamara J. Low Foon, Toronto (CA); Jason Lee Pack, North York (CA); Yvan Large, Richmond Hill (CA); Shahin Amiri, Richmond Hill (CA); Saanjali Maharaj, Toronto (CA); Srinivasarao Konakalla, Bangalore (IN); Feroze Khan, Bangalore (IN); Nagaraj K, Bangalore (IN); Babu Triplicane Gopikrishnan, Bangalore (IN); Yogesh Channaiah, Mandya (IN)

(73) Assignee: Intel Corporation, Santa Clara, CA (US)

( * ) Notice: Subject to any disclaimer, the term of this patent is extended or adjusted under 35 U.S.C. 154(b) by 971 days.

(21) Appl. No.: 17/555,344

(22) Filed: Dec. 17, 2021

(65) Prior Publication Data

US 2022/0117122 A1    Apr. 14, 2022

(51) Int. Cl.
*H05K 7/20*          (2006.01)

(52) U.S. Cl.
CPC ....... *H05K 7/20836* (2013.01); *H05K 7/2039* (2013.01); *H05K 7/20736* (2013.01)

(58) Field of Classification Search
CPC ............. H05K 7/20736; H05K 7/2039; H05K 7/20836
USPC .......................................................... 165/289
See application file for complete search history.

(56) References Cited

U.S. PATENT DOCUMENTS

| | | | | | |
|---|---|---|---|---|---|
| 7,626,821 | B1 * | 12/2009 | Buffington | ............ | H01L 23/427 |
| | | | | | 174/15.2 |
| 7,796,383 | B2 * | 9/2010 | Kavanagh | ............ | H04N 9/3144 |
| | | | | | 165/185 |
| 7,909,087 | B2 * | 3/2011 | Kimura | ................ | H01L 23/473 |
| | | | | | 165/80.3 |
| 9,110,476 | B2 * | 8/2015 | David | ................ | G05D 23/1919 |
| 9,158,311 | B2 * | 10/2015 | Geissler | ............ | H05K 7/20745 |
| 9,342,079 | B2 * | 5/2016 | David | .................... | G05D 23/00 |
| 9,506,821 | B1 * | 11/2016 | Robillard | ............... | G01K 7/427 |
| 9,791,903 | B2 * | 10/2017 | Hay | .................... | H05K 7/20836 |
| 10,939,592 | B2 * | 3/2021 | Avalos Garcia | ... | H05K 7/20927 |

(Continued)

*Primary Examiner* — Claire E Rojohn, III
(74) *Attorney, Agent, or Firm* — Hanley, Flight & Zimmerman, LLC

(57) ABSTRACT

An apparatus is described. The apparatus includes a semiconductor chip package having a semiconductor chip therein. The semiconductor chip package to communicate a temperature of the semiconductor chip. The apparatus includes a heat sink that is thermally coupled to the semiconductor chip package. The heat sink has fins. The apparatus includes a fan. The apparatus includes a temperature sensing device. The temperature sensing device is to sense a temperature of an ambient before the ambient is warmed by the fins. A rotational speed of the fan is to be determined from the temperature of the semiconductor chip and the temperature of the ambient.

20 Claims, 9 Drawing Sheets

(56)         References Cited

U.S. PATENT DOCUMENTS

| | | | | |
|---|---|---|---|---|
| 11,079,818 B2* | 8/2021 | Lu | G06F 1/206 | |
| 11,106,255 B2* | 8/2021 | Watanabe | G06F 1/20 | |
| 2002/0139515 A1* | 10/2002 | Azar | H01L 23/467 | |
| | | | 257/E23.099 | |
| 2005/0024828 A1* | 2/2005 | Espinoza-Ibarra | H05K 7/207 | |
| | | | 361/695 | |
| 2006/0002083 A1* | 1/2006 | Foster | H01L 23/467 | |
| | | | 257/E23.099 | |
| 2007/0091565 A1* | 4/2007 | Malone | H05K 7/20145 | |
| | | | 257/E23.099 | |
| 2008/0040067 A1* | 2/2008 | Bashor | G06F 11/24 | |
| | | | 714/E11.154 | |
| 2009/0296342 A1* | 12/2009 | Matteson | G06F 1/206 | |
| | | | 361/679.46 | |
| 2010/0157522 A1* | 6/2010 | Refai-Ahmed | G06F 1/20 | |
| | | | 361/679.54 | |
| 2012/0014063 A1* | 1/2012 | Weiss | H05K 7/20909 | |
| | | | 361/697 | |
| 2012/0143389 A1* | 6/2012 | Wang | G06F 1/206 | |
| | | | 700/300 | |
| 2012/0224322 A1* | 9/2012 | Artman | H05K 7/20209 | |
| | | | 361/679.48 | |
| 2013/0146273 A1* | 6/2013 | Chester | G06F 1/20 | |
| | | | 361/699 | |
| 2013/0168058 A1* | 7/2013 | Chamseddine | F28D 7/0075 | |
| | | | 165/104.26 | |

| | | | |
|---|---|---|---|
| 2013/0264027 A1* | 10/2013 | Eckberg | H05K 7/20836 |
| | | | 702/182 |
| 2013/0265719 A1* | 10/2013 | Eckberg | H05K 7/20536 |
| | | | 361/701 |
| 2013/0340995 A1* | 12/2013 | David | F28F 27/00 |
| | | | 165/287 |
| 2013/0340996 A1* | 12/2013 | David | G05D 23/1919 |
| | | | 165/287 |
| 2013/0345893 A1* | 12/2013 | David | H05K 7/20836 |
| | | | 700/300 |
| 2014/0052311 A1* | 2/2014 | Geissler | G05D 23/19 |
| | | | 700/299 |
| 2014/0195066 A1* | 7/2014 | Nanda | G06F 1/206 |
| | | | 700/300 |
| 2014/0340787 A1* | 11/2014 | Kwon | G11B 5/5582 |
| | | | 360/77.05 |
| 2016/0278198 A1* | 9/2016 | Matsumoto | H01L 23/36 |
| 2016/0363968 A1* | 12/2016 | Schubert | H05K 1/0203 |
| 2020/0321838 A1* | 10/2020 | Battiston | H05K 7/20172 |
| 2021/0274685 A1* | 9/2021 | Bhatia | H05K 7/20154 |
| 2021/0294397 A1* | 9/2021 | Haley | G06F 1/20 |
| 2022/0087076 A1* | 3/2022 | Malouin | H05K 7/20736 |
| 2022/0117122 A1* | 4/2022 | Kalantarian | H05K 7/20736 |
| 2023/0124192 A1* | 4/2023 | Liedtke | F24T 10/10 |
| | | | 165/45 |
| 2023/0320010 A1* | 10/2023 | Suryawanshi | G06F 1/185 |
| 2024/0029539 A1* | 1/2024 | Subrahmanyam | |
| | | | H05K 7/20272 |
| 2024/0250054 A1* | 7/2024 | Gutenburg | H01L 23/367 |

* cited by examiner

FAN 403

TEMPERATURE
SENSOR 407

HEAT SINK FINS 402

MODULE WITH IMPROVED THERMAL COOLING PERFORMANCE

BACKGROUND

System design engineers face challenges, especially with respect to high performance data center computing, as both computers and networks continue to pack increase their levels of performance resulting in higher heat dissipation and/or a greater ranges of heat dissipation. Creative packaging solutions are therefore being designed to keep pace with the thermal requirements of such aggressively designed systems.

FIGURES

Figures 5A, 5B:
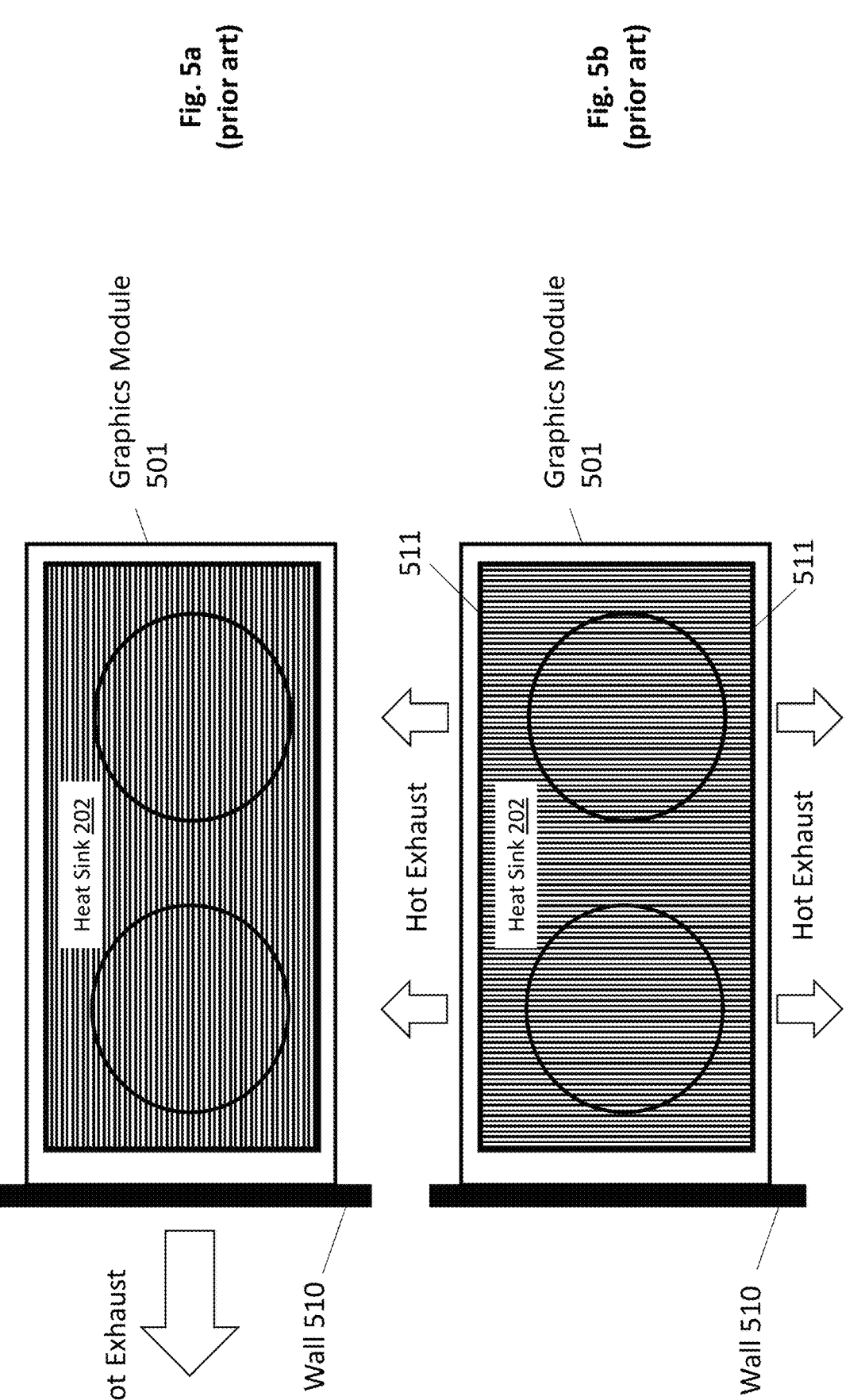
Figure 6:
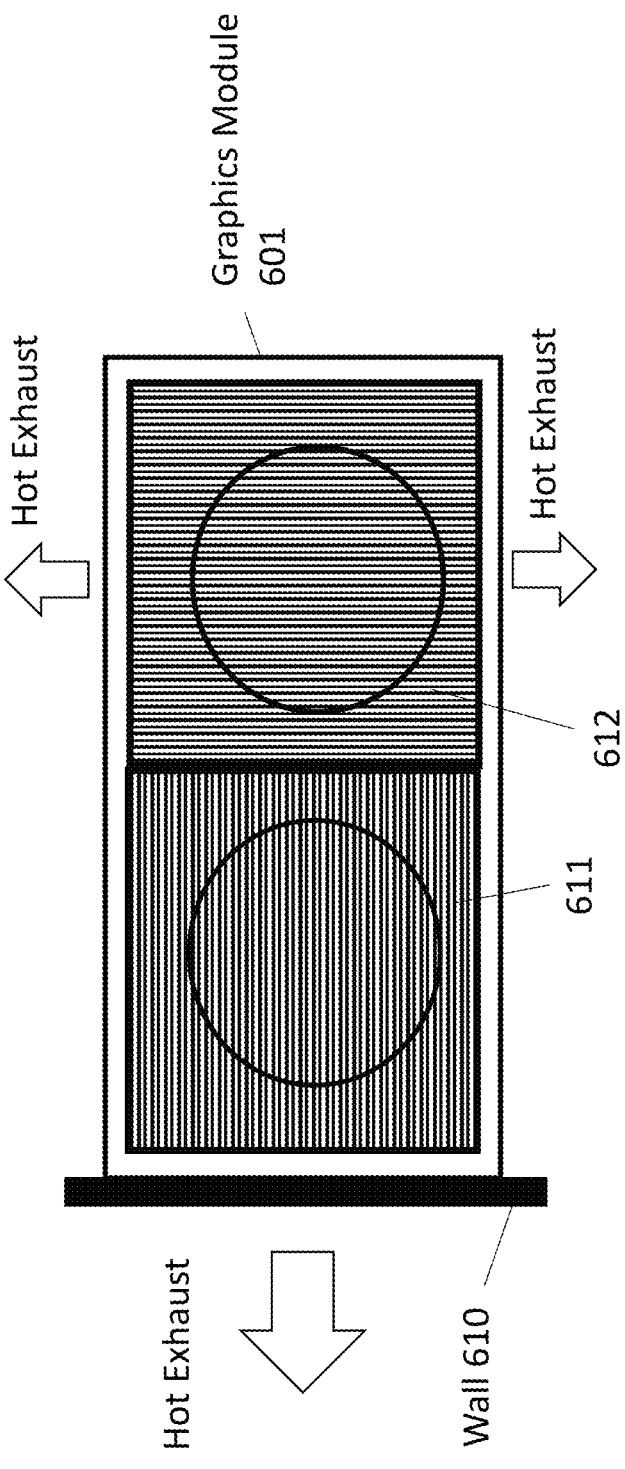
Figure 7:
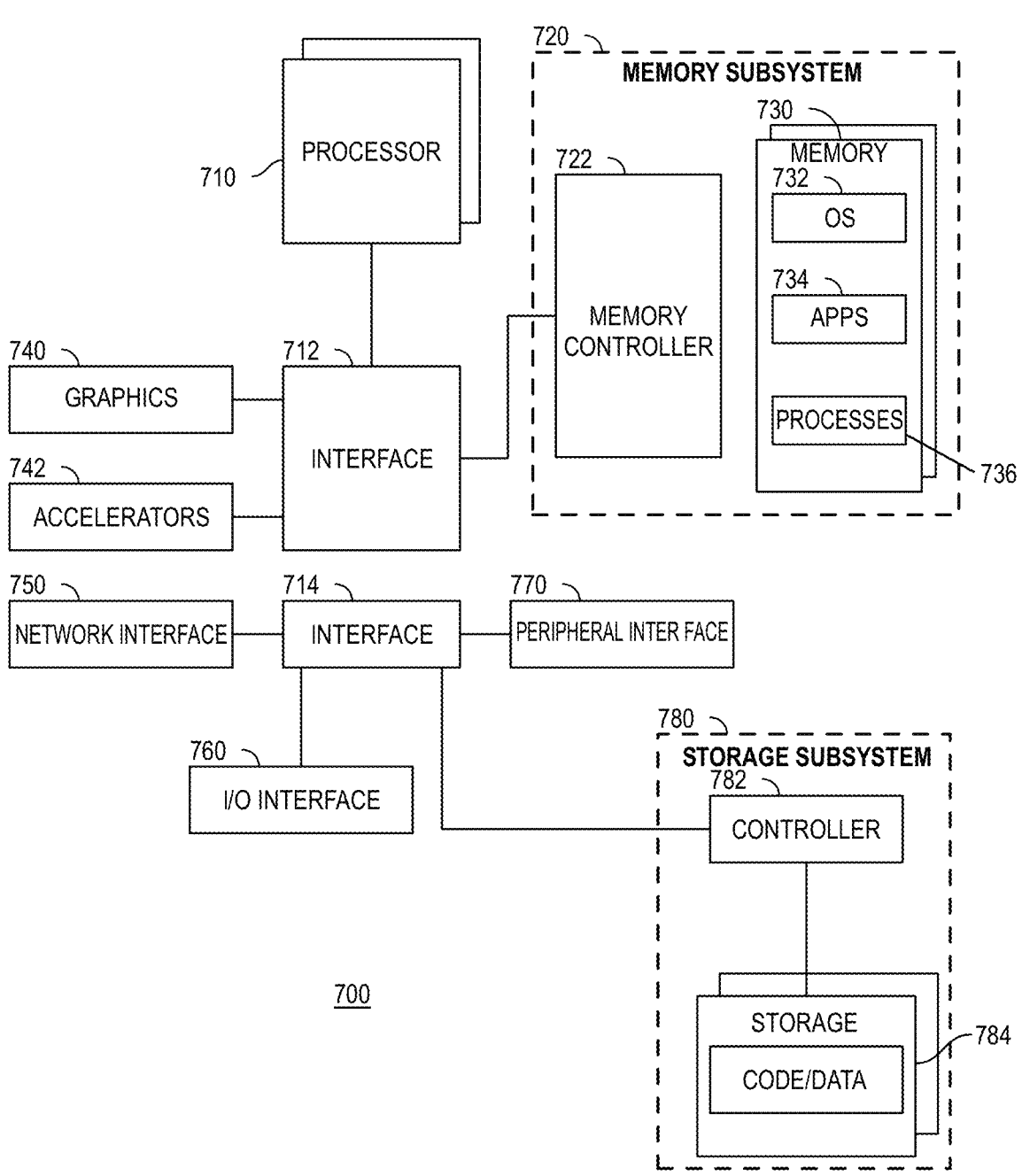
Figure 8:
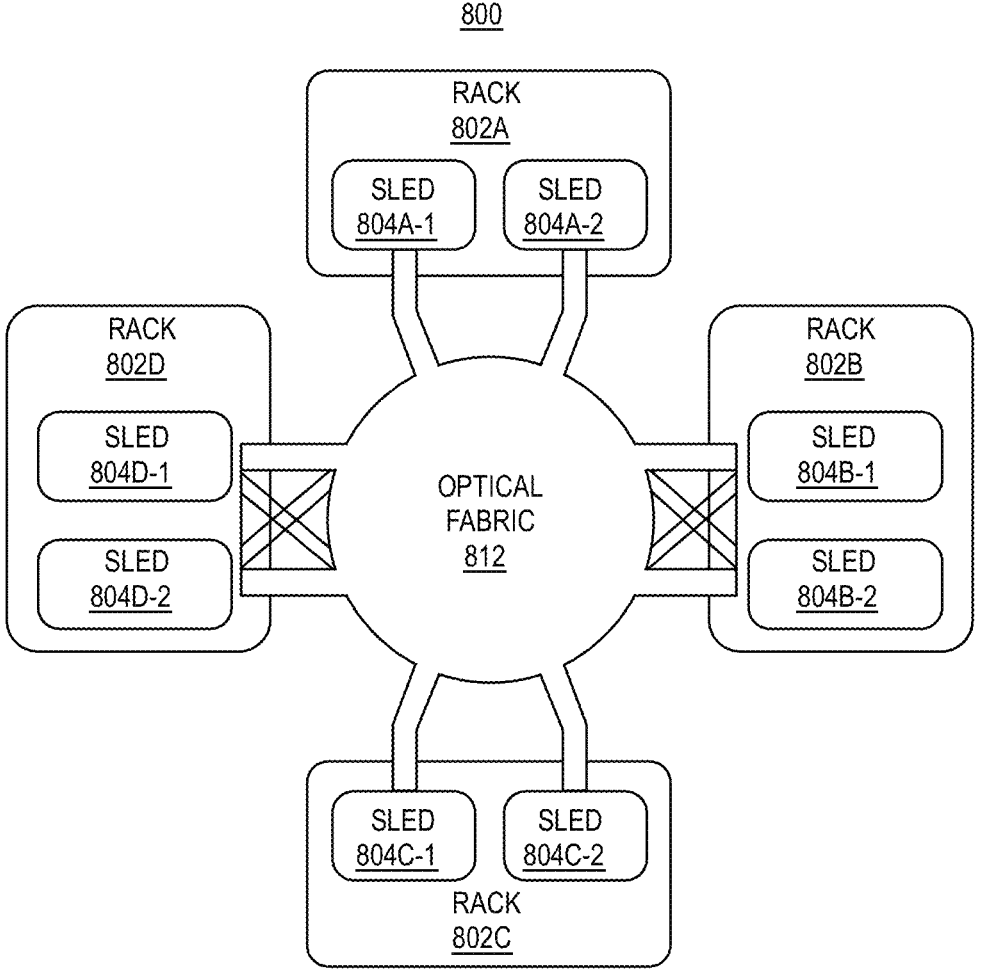
Figure 9:
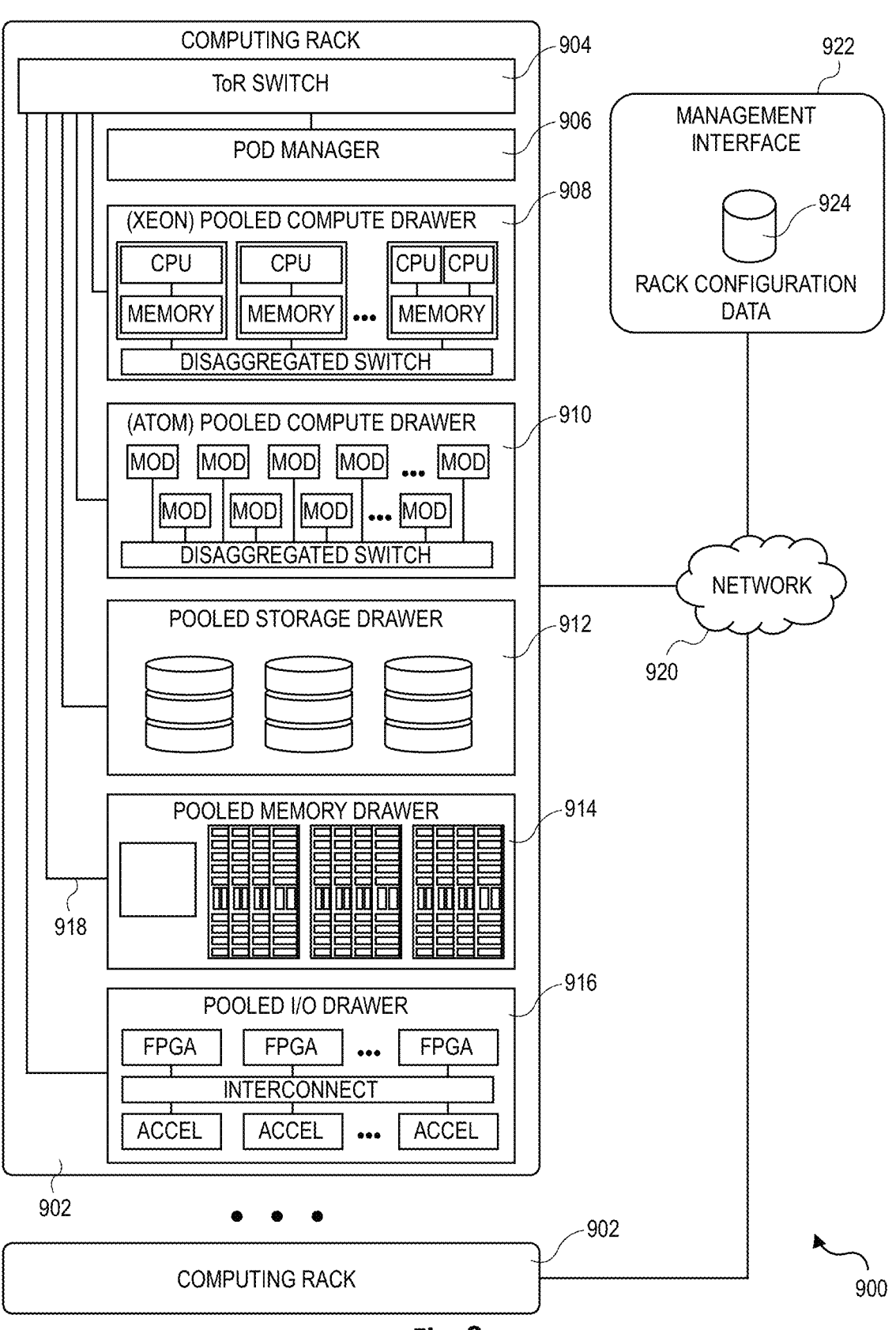

FIGS. 5*a* and 5*b* show different heat sink orientations for a module (prior art);

FIG. 6 shows improved heat sink orientations for a module;

FIG. 7 shows a system;

FIG. 8 shows a data center;

FIG. 9 shows a rack.

DETAILED DESCRIPTION

Figure 1:
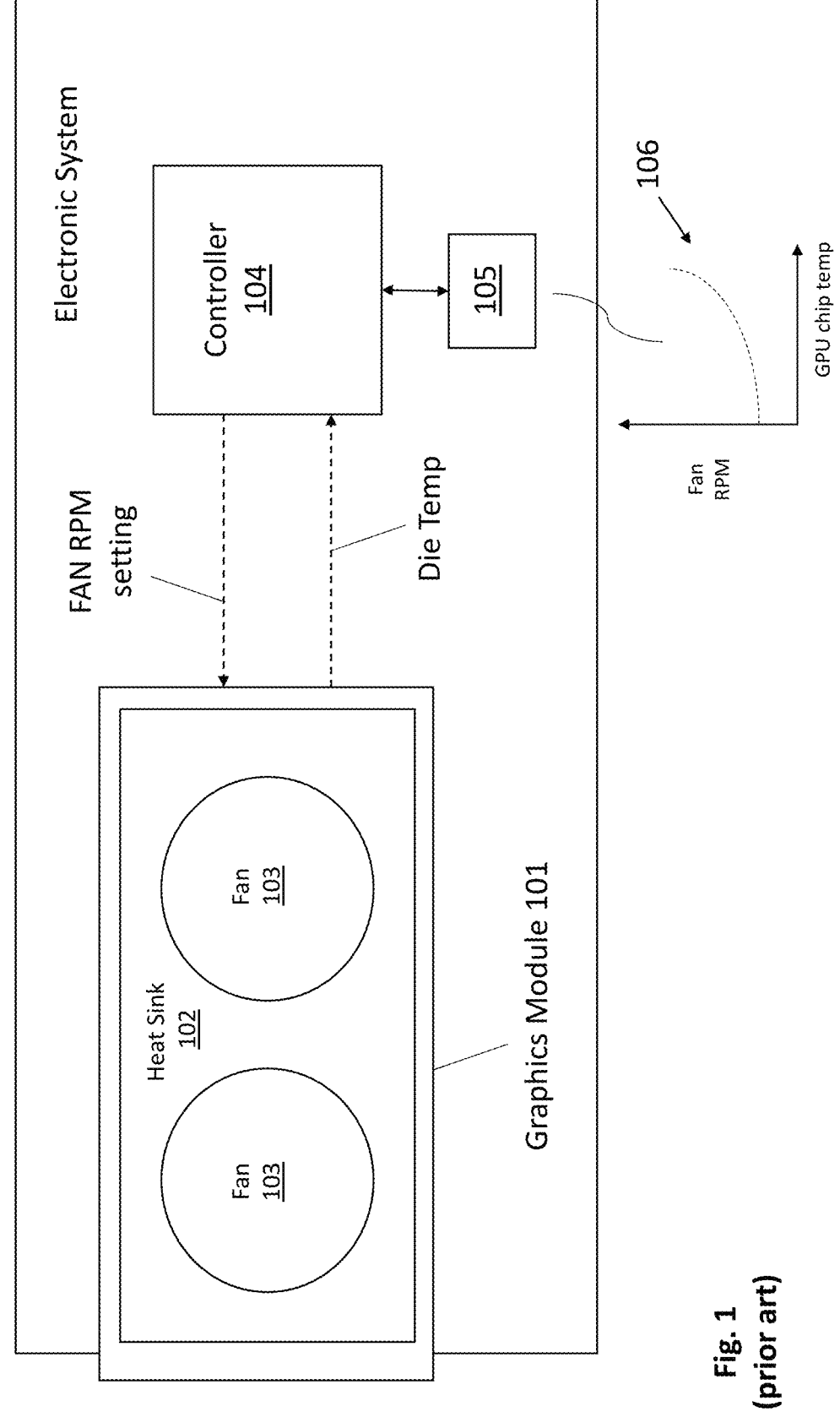
FIG. 1 shows a prior art module.

FIG. 1 shows various components of a typical graphics module 101. As observed in FIG. 1, the graphics module 101 includes a graphics processing unit (GPU) with a heat sink 102 and a plurality of fans 103. The heat sink 102 is thermally coupled to a semiconductor chip package which includes a GPU chip inside (the package is not visible because of the top-down view of FIG. 1). The fans 103 draw air into the graphics module 101. The air flows through the fins of the heat sink 102 and is then blown out of the module 101 as hot exhaust.

A controller 104 controls the rotational speed of the fan based on the temperature of the GPU chip. As observed in FIG. 1, the controller 104 is resident in a host system 100. Here, the module's GPU semiconductor chip includes an embedded thyristor or other temperature sensing device and reports the GPU chip's internal temperature to the controller 104. The controller 104, in response, performs a look-up on tabular information 105 that is provided by the manufacturer of the graphics module 101.

The tabular information 105 specifies which fan RPM (rotational speed) is appropriate for a particular GPU chip temperature. The controller 104 determines from the tabular information 105 the appropriate fan RPM based on the GPU chip temperature and then sends a command to the graphics module 101 to set the rotational speed of the fans 103 to the determined fan RPM.

A problem is that the RPM vs. GPU temperature curve 106 that is tabulated in the tabular information 105 is only applicable to a particular ambient temperature, whereas, a more optimal RPM setting will based not only GPU chip temperature but also ambient temperature. The ambient temperature is the temperature of the air that is blown into the fins of the heat sink 102.

Here, for a same RPM speed, less heat will be drawn out of the GPU chip as the ambient temperature increases. Said another way, it is more difficult to keep the GPU chip sufficiently cool as the temperature of the ambient air that flows through the heat sink fins increases. As such, at higher ambient temperatures, sufficient GPU chip cooling is achieved with a higher fan RPM than what would be sufficient if the ambient temperature were cooler.

The particular RPM vs. GPU temperature curve 106 that is embodied in the tabular information 105 provided by the graphics module manufacturer is typically for a high ambient temperature. By providing an RPM vs. GPU temperature curve 106 that is for a high ambient temperature (e.g., a maximum allowed ambient temperature), the GPU chip is guaranteed to be sufficiently cool if the ambient temperature actually reaches the high temperature.

In other environments where the ambient is less than the high temperature, the GPU chip will be over-cooled (the tabular information 105/106 specifies an RPM that is faster than what is needed to sufficiently cool the GPU chip). However, the GPU chip is guaranteed to operate correctly at the cooler temperature so the graphics manufacturer is satisfied that the performance metrics of the module 101 will be met irrespective of whether the ambient temperature is high or less than high.

A problem is that, even though minimal performance metrics are guaranteed to be met with the above described approach, opportunity losses exist with respect to acoustic noise. More specifically, generally, running the fan at an RPM speed that is higher than needed to sufficiently cool the GPU corresponds to excess noise that could have been eliminated if the fan were run at a lower speed that would have nevertheless sufficiently cooled the GPU die at the instant ambient temperature.

A solution is to incorporate more than one RPM vs. GPU die temperature curve in the tabulated information.

Figure 2:
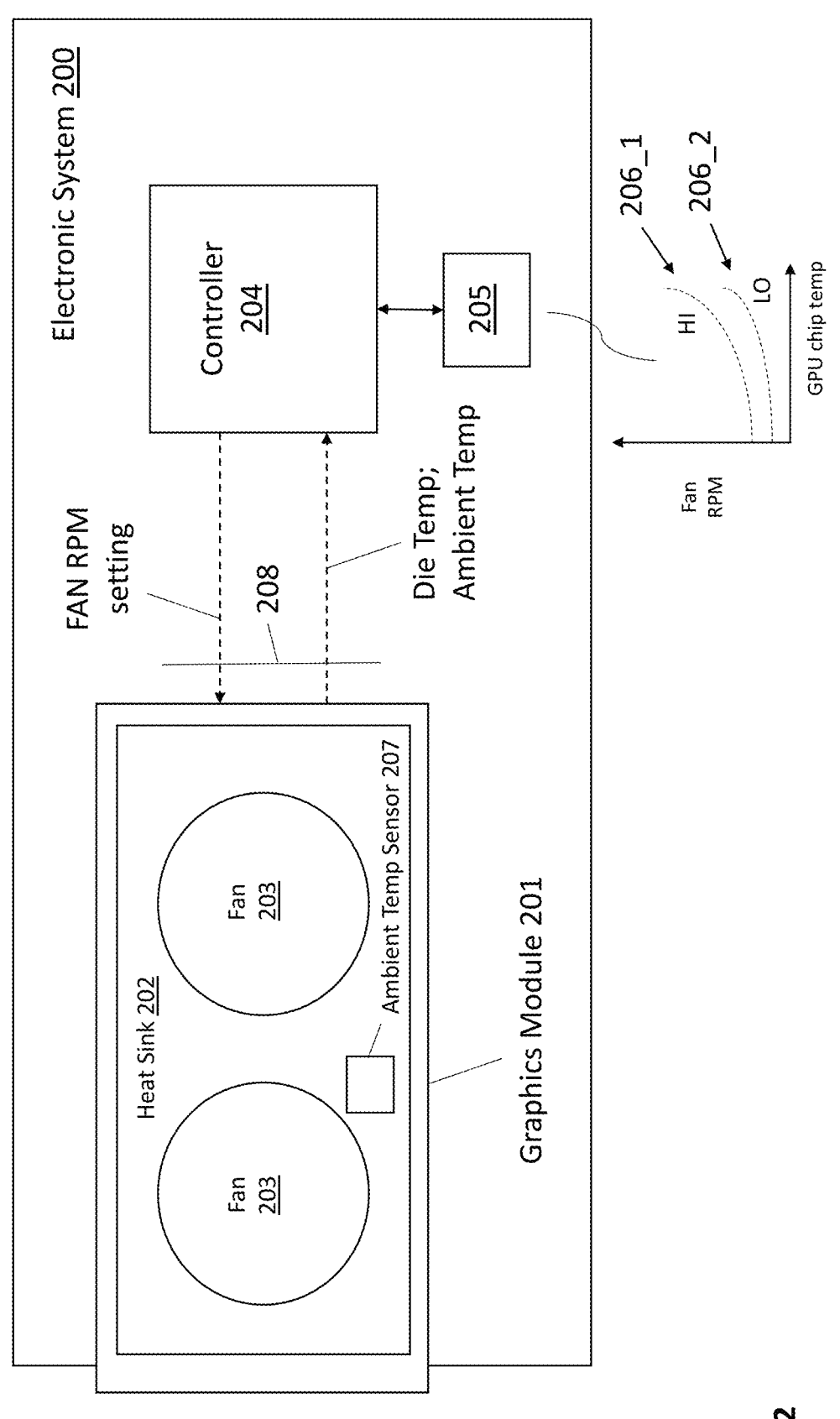
FIG. 2 shows an improved module.

FIG. 2 shows an improved graphics module 201 that incorporates this approach. As observed in FIG. 2 the tabular information 205 includes a first high ("HI") ambient temperature curve 206_1 and a second low ("LO") ambient temperature curve 206_2. In various embodiments, the high ambient temperature curve 206_1 is the same/similar information 106 as is used in the prior art approach. The lower position of the low ambient temperature curve 206_2 relative to the high ambient temperature curve 206_1 demonstrates that the GPU chip can be sufficiently cooled at lower fan speeds when the ambient temperature is low.

Figure 3:
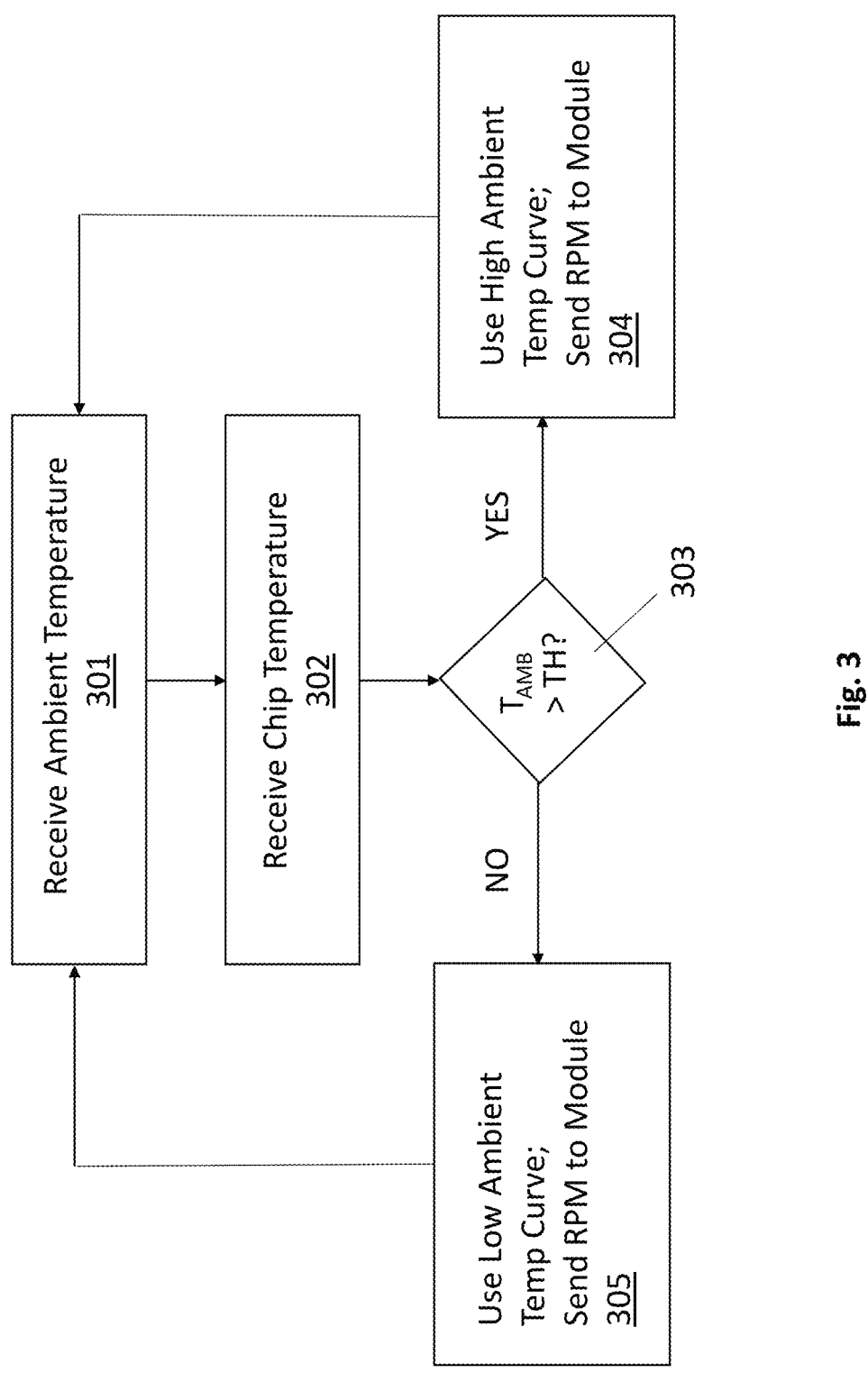
FIG. 3 shows a method for controlling the improved module of FIG. 2.

FIG. 3 shows a method that is performed by the controller of the improved graphics module of FIG. 2. As observed in FIG. 3, the method includes receiving a GPU chip temperature 301 from the graphics module and receiving an ambient temperature 302 generated from a temperature sensing device 207 that is placed within the ambient of the graphics module 301 (e.g., a temperature sensor that is placed in the space between the fans 203 and the fins of the heat sink 202).

If the ambient temperature is above some threshold 303, the high ambient temperature curve 206_1 is used to determine the appropriate fan speed 304. If the ambient temperature is beneath some threshold 303, the low ambient temperature curve 206_2 is used to determine the appropriate fan speed 305. The process then continually repeats.

In various embodiments, hysteresis is built into the threshold comparison 303 to prevent thrashing of the fan speed determination between and high and low ambient temperature curves 206_1, 206_2 at ambient temperatures that are near the threshold. For example, if the high ambient temperature curve 206_1 is being used 304 to determine fan speed, the ambient temperature reading 301 must fall beneath $V_t - \Delta T$ to switch to use of the low ambient temperature curve 305. By contrast, if the low ambient temperature curve is being used 305 to determine fan speed, the ambient temperature reading must rise above Vt+ΔT to switch to use of the high ambient temperature curve 304.

In further extended embodiments, more than two RPM vs. GPU die temperature curves 206_1, 206_2 are recorded in the tabular information 205 for a corresponding more than two, different ambient temperatures. For example, four different curves are recorded for four different ambient temperatures and the methodology of FIG. 3 is expanded to branch into four different paths based on the ambient reading. By expanding the number of curves that are utilized, the precision of the fan's RPM setting is improved thereby further reducing acoustic noise opportunity loss.

In various embodiments, as suggested by FIG. 2, the ambient temperature sensor 207 is mechanically integrated with the graphics module. A portion of the electrical interface 208 between the graphics module 201 and the host electronic system 200 is used to communicate the ambient temperature reading to the controller 204 (e.g., a processor, application specific integrated circuit (ASIC) or controller). For example, in various embodiments the electrical interface 208 includes an I2C bus and the ambient temperature that is sensed by the graphics module 201 is transmitted from the graphics module 201 to the host/controller over the I2C bus. Likewise, the GPU chip temperature reading can also be communicated over the I2C bus (or some other portion of the interface).

Figure 4:
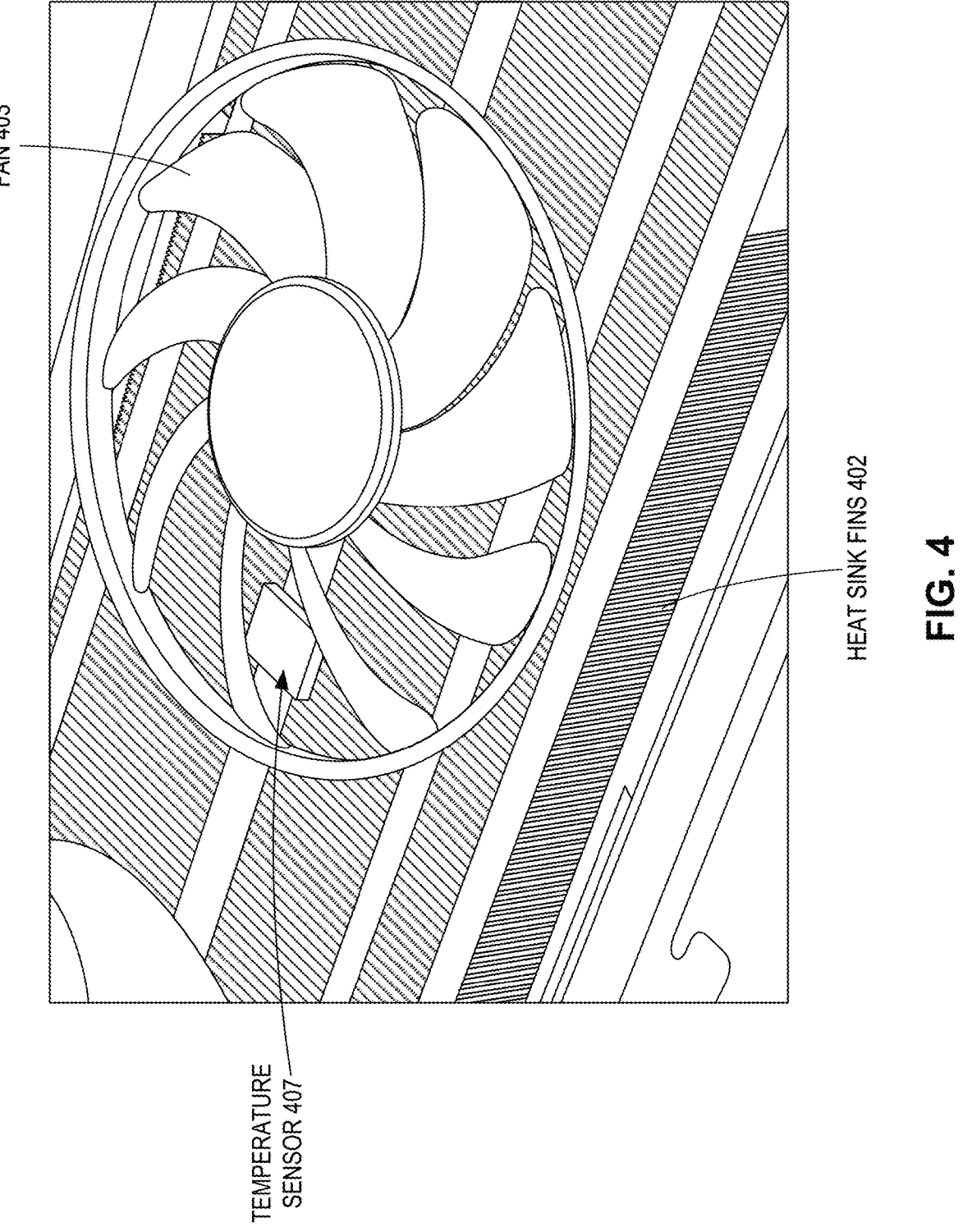
FIG. 4 shows a temperature sensor integrated between a fan and fins of a heat sink.

In various embodiments, as depicted in FIG. 4, the ambient temperature sensor 407 is not only integrated on the graphics module but is closely integrated with the ambient region of the heat sink so that an accurate assessment of the thermal conditions that affect the GPU chip temperature can be made. Here, as can be seen in FIG. 4, the graphic module's mechanical construction is such that the fan 403 is positioned directly above the GPU heat sink fins 402 and the temperature sensor 407 is placed directly beneath the fan 403 between the fan 403 and the heat sink fins 402.

During operation, the rotation of the fan 403 causes air to be drawn from outside the graphics module into the fins 402 of the heat sink. The air also blows directly across the temperature sensor 407 before the air is heated by the heat sink. Thus, the temperature sensor 407 measures the actual ambient temperature as applied to the heat sink 402.

In various embodiments, the controller 204 is implemented, e.g., with one or more processors or controllers that are integrated on the host side (off the module 201) and that execute program code of some kind (e.g., device driver software of the module 201) to implement the methodology of FIG. 3. In other embodiments, one or more processors or controllers are integrated on the module 201 so that the methodology of FIG. 3 is at least partially if not wholly implemented on the module 201 (in the case of partial execution of the methodology of FIG. 3 on the module 201, host processor(s)/controller(s) can perform the remainder). In any of these approaches, dedicated logic circuitry (e.g., field programmable gate array (FPGA), application specific integrated circuit (ASIC)) can be used, partially or wholly with respect to the implementation of the methodology of FIG. 3, instead of the execution of program code.

Notably, the different fan rotational speed vs. chip temperature "curves" can be implemented as tabular information (specific output values are listed for specific input values) or actual mathematical expressions (e.g., that are embedded in program code or logic circuitry) and executed to provide an output value for a particular input value. Sets of tabular information or corresponding mathematical expressions more generally describe fan rotational speed vs. chip temperature relationships.

Also, notably, each of the articulated relationships correspond to a range of ambient temperatures. That is, the "high" curve/relationship is used for the range of ambient temperatures above a threshold while the "low" curve/relationship is used for the range of ambient temperatures below the threshold.

There are also general issues concerning the heat sink design. FIGS. 5a and 5b show two different "top-down" views of a graphics module. In both cases the module plugs into the host system moving from left to right. Thus, wall 510 corresponds, e.g., to a back panel of a computer system that the graphics module is plugged into. The region to the right of the wall represents the inside of the computer system, whereas, the region to the left of the wall represents open space "behind" the back of the computer system.

FIG. 5a shows a first orientation in which the air flow channels that run between the heat sink fins flow to the wall 510 of the electronic system. FIG. 5b shows a second orientation in which the air flow channels that run between the heat sink fins run to the sidewalls 511 of the graphics module.

In both cases the fans are situated, e.g., on the top or bottom of the graphics module (the outlines of the fans are depicted in FIGS. 5a and 5b). The fans draw air from inside the electronic system into the graphics module and into the heat sink fins. The drawn-in air then flows through the air flow channels formed by the heat sink fins. In the case of the first fin orientation of FIG. 5a, the exhaust air is blown out of the system through the system wall 510. In the case of the second fin orientation of FIG. 5b, the exhaust air is blown into the system through the side walls 511 of the graphics module.

The different fin orientations and corresponding air flows result in different cooling characteristics of the GPU chip. In particular, the first orientation of FIG. 5a results in cooler air inside the electronic system chassis than the second orientation of FIG. 5b, because, with the first orientation of FIG. 5a the hot exhaust air is blown into the open space outside the system, whereas, with the second orientation of FIG. 5b the hot exhaust air is blown into the electronic system.

By contrast, because of the elongated aspect ratio of the graphics module, the first orientation of FIG. 5a, having longer air flow channels, creates greater air-flow resistance as observed by the fans than the second orientation of FIG. 5b which has shorter air flow channels. The greater air-flow resistance in the orientation of FIG. 5a results in slower air flow through the heat sink of FIG. 5a than through the heat sink of FIG. 5b. The slower air flow results in reduced cooling efficiency of the heat sink of FIG. 5a as compared to the heat sink of FIG. 5b.

As such, the different heat sink fin orientations can be characterized as a first fin orientation (FIG. 5a) in which the temperature of the air inside the system chassis is lower but the cooling efficiency of the heat sink and fans is reduced, whereas, with the second fin orientation (FIG. 5b), the air temperature inside the system chassis is higher but the cooling efficiency of the heat sink and fans is enhanced.

FIG. 6 shows an improved approach in which both heat sink fin orientations are exhibited within a same graphics card module 601. Here, as observed in FIG. 6, a first portion of heat sink fins 611 that are closer to the free space outside the system chassis exhibit the first orientation of FIG. 5a, whereas, a second portion of heat sink fins 612 that are deeper inside the system chassis exhibit the second orientation.

The inclusion of the second portion 612 with the second orientation results in the air-flow channel length being greatly reduced in the first portion 611 having the first orientation. As such, the air flow resistance along the channels in the first portion 611 is much less in the improved approach of FIG. 6 than the approach of FIG. 5a. Thus, the cooling efficiency of the heat sink and fan in the first portion 611 is better than the cooling efficiency of the heat sink and fan in the approach of FIG. 5a.

With the second portion 612 already having an enhanced heat sink and fan cooling efficiency because of its fin orientation, the entire graphics module 601 has enhanced heat sink and fan cooling efficiency. Moreover, although some hot exhaust is blown back into the chassis by the second portion 612, the total amount is less than that with the approach of FIG. 5b.

Thus, the approach of FIG. 6 has the enhanced heat sink and fan cooling efficiency that is characteristic of the approach of FIG. 5b, but with less exhaust blown into the system chassis. Thus, the approach of FIG. 6 is improved over either of the approaches of FIGS. 5a and 5b.

Although the embodiment of FIG. 6 is directed to a dual fan solution, the overall approach can be applied to different numbers of fans (e.g., one fan, three fans, four fans, etc.). In a base case there is a separate heat sink and GPU die or package for each fan.

In this case, for the approach of FIG. 6, there is a first heat sink and GPU die/package for the first portion and there is a second heat sink and GPU die/package for the second portion. In other embodiments, a single heat sink can have both orientation (e.g., a first portion of the heat sink has the first orientation and a second portion of the heat sink has the second orientation). For example, in an embodiment having only a single GPU die/package, the single heat sink that is thermally coupled to the single GPU die/package has a first portion with the first fin orientation and a second portion with the second fin orientation.

As another example, in an embodiment having three GPU dies/packages and three heat sinks (one heat sink coupled to each GPU die/package), the heat sink that is closest to the outside of the chassis has the first orientation, the heat sink that is farthest within the chassis has the second orientation and the heat sink that is neither of these has both orientations.

Although the first and second portions 611, 612 of FIG. 6 are observed to be 50% of the total heat sink area for both portions (the first portion 611 consumes about 50% of the heat sink surface area and the second portion 612 consumes about 50% of the heat sink surface area), other embodiments may have different, unequal surface areas for the different portions. For example, if fans having weaker ability to drive air flow resistance are used, the second portion 612 can be expanded (e.g., to more than 50%) and the first portion 611 can be reduced (e.g., to less than 50%). The same approach can be used if the air temperature within the electronic system is expected to be cooler (e.g., because a high performance cooling system is used in the system) making the hot exhaust into the system from the second portion 612 less of a concern.

Likewise, if fans having stronger ability to drive air flow resistance are used, the first portion 611 can be expanded (e.g., to be more than 50%) and the second portion 612 reduced (e.g., to less than 50%). The same approach can be used if the air temperature within the electronic system is expected to be higher (e.g., because a lower performance cooling system is used in the system) making the hot exhaust into the system from the second portion 612 more of a concern.

Importantly a single graphics module can include the improvements of both FIGS. 2-4 and FIG. 6 as described above. That is, a graphics module that uses multiple RPM vs. GPU chip temperature curves for different ambient temperatures and that has a heat sink structure with multiple fin orientations can all be included in a single module.

In further embodiments the cooling capacity of the electronic system chassis and the temperature outside the chassis can exert some influence on the RPM setting that is chosen for a particular ambient temperature and GPU chip temperature. For example, if the temperature outside the system chassis is higher, the selected RPM setting can be adjusted upward a certain amount from the curve reading, and/or, a curve for a next higher ambient temperature can be used. Likewise, if the temperature outside the system chassis is lower, the selected RPM setting can be adjusted downward a certain amount from the curve reading, and/or, a curve for a next lower ambient temperature can be used.

Although embodiments above have been described in reference to a graphics module having a GPU, the teachings above can be extended to various kinds of peripherals and/or modules (e.g., accelerator modules) that include functionality other than a GPU and/or graphics processing.

Examples include accelerators for artificial intelligence (e.g., machine learning engines, inference engines, neural network processors), "X" processor units (XPUs), network processors, infrastructure processing units (IPUs), data processing units (DPUs), high performance memory or storage modules, etc. As such the module improvements described above can be applied to any of a number of different kind of modules that plug into a larger system (e.g., Open Compute Project Accelerator Modules (OAM) modules, storage modules, memory modules, networking adaptors modules, etc.). As such, in various embodiments the interface 208 supports any of a number of different interfaces (e.g., NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI), Peripheral Component Interconnect express (PCIe), various JEDEC interfaces, etc.).

The following discussion concerning FIGS. 7, 8 and 9 are directed to systems, data centers and rack implementations, generally. FIG. 7 generally describes possible features of an electronic system that can include one or more modules designed according to the teachings above. For example, a module having the improvements described above may plug into a system having features described in FIG. 7 (the module may perform one or more of the architectural components described in FIG. 7). FIG. 8 describes possible features of a data center that can include such electronic systems. FIG. 9 describes possible features of a rack having one or more such electronic systems installed into it.

In data center environments, different computer systems of the data center may be configured with respective instances of software to implement functionality of the data center. A particular instance of software may be executed on one of the computer systems and invoke an accelerator module installed in the one computer system. The module can have any of the improvements described above.

FIG. 7 depicts an example system. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software functionality to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data in a persistent state (e.g., the value is retained despite interruption of power to system

700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 7, other types of systems to which the above described invention can be applied and are also partially or wholly described by FIG. 7 are communication systems such as routers, switches and base stations.

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks.

Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 that includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or an 100+ Gb/s Silicon Photonics (SiPh) optical link. In one embodiment high-speed link 918 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack plug-gable processing component, a rack pluggable memory component, a rack pluggable storage component, a rack pluggable accelerator component, etc.).

Multiple of the computing racks 900 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations. RSD environment 900 further includes a management inter-face 922 that is used to manage various aspects of the RSD environment. This includes managing rack configuration, with corresponding parameters stored as rack configuration data 924.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-remov-able memory, erasable or non-erasable memory, writeable or re-writeable memory, and so forth. In some examples, the program code implements various software elements, such as software components, programs, applications, computer programs, application programs, system programs, machine programs, operating system software, middleware, firm-ware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
   a) semiconductor chip package having a semiconductor chip therein, the semiconductor chip package to communicate a temperature of the semiconductor chip;
   b) a heat sink that is thermally coupled to the semiconductor chip package, the heat sink including fins;
   c) a fan to blow ambient air towards the heat sink; and
   d) a temperature sensing device, the temperature sensing device to sense a temperature of the ambient air before the ambient air is warmed by the fins, the temperature sensing device downstream of the fan along a flow path of the ambient air between the fan and the fins, a rotational speed of the fan to be determined from the temperature of the semiconductor chip and the temperature of the ambient air.

2. The apparatus of claim 1, wherein the fins have different portions with different orientations.

3. The apparatus of claim 2, wherein a first of the different orientations has higher air-flow resistance and causes first exhaust to be blown outside an electronic system, and a second of the different orientations has lower air-flow resistance and causes second exhaust to be blown into the electronic system.

4. The apparatus of claim 1, wherein an interface is to send the temperature of the ambient air and the temperature of the semiconductor chip into an electronic system and is to receive the rotational speed of the fan from the electronic system.

5. The apparatus of claim 1, wherein the rotational speed of the fan is to be determined from a selected fan rotational speed vs. semiconductor chip temperature relationship, the selected fan rotational speed vs. semiconductor chip temperature relationship selected from amongst a plurality of different fan rotational speed vs. semiconductor chip temperature relationships each directed to a different, respective ambient temperature range, the temperature of the ambient air within a respective temperature range of the selected fan rotational speed vs. semiconductor chip temperature relationship.

6. The apparatus of claim 1, further including e) an interface to plug into an electronic system.

7. An electronic system comprising:
   a controller;
   a module interface coupled to the controller; and
   the apparatus of claim 1.

8. The electronic system of claim 7, wherein the module interface is to send the temperature of the ambient air and the temperature of the semiconductor chip to the controller and is to receive the rotational speed of the fan from the controller.

9. The electronic system of claim 8, wherein the controller is to execute program code to determine the rotational speed of the fan based on a selected fan rotational speed vs. semiconductor chip temperature relationship.

10. A data center, comprising a plurality of computing systems, the plurality of computing systems plugged into a plurality of racks, the plurality of computing systems communicatively coupled through one or more networks and configured to execute respective instances of software to implement functionality of the data center, a first instance of the respective instances of software to invoke an accelerator module installed on a first one of the computer systems that executes the first instance, the accelerator module including the apparatus of claim 1.

11. The data center of claim 10, wherein the apparatus is to send the temperature of the ambient air and the temperature of the semiconductor chip into the first computer system and is to receive the rotational speed of the fan from the first computer system.

12. The apparatus of claim 1, wherein the temperature sensing device is located underneath the fan, and the ambient air is to be blown from the fan towards the temperature sensing device.

13. The apparatus of claim 1, wherein the rotational speed of the fan is based on a first relationship of a plurality of different relationships between fan rotation speed and semiconductor chip temperature, the first relationship selected from among the plurality of different relationships based on the temperature of the ambient air.

14. The apparatus of claim 13, wherein each of the different relationships is associated with a different range of potential temperatures for the ambient air.

15. The apparatus of claim 13, wherein the rotational speed of the fan is based on the first relationship when the temperature of the ambient air exceeds a threshold.

16. The apparatus of claim 15, wherein the threshold is a first threshold, and the rotational speed of the fan is based on a second relationship of the plurality of different relationships when the temperature of the ambient air is below a second threshold, the first threshold higher than the second threshold.

17. The apparatus of claim 1, wherein the heat sink is a first heat sink and the fins are first fins at a first orientation, and the apparatus further includes a second heat sink including second fins at a second orientation and a third heat sink including third fins at a third orientation, wherein the first heat sink is located closest to an outside of a chassis, the second heat sink is located closest to an inside of the chassis, and the third heat sink is located between the first heat sink and the second heat sink.

18. The apparatus of claim 1, wherein the flow path follows a straight line between the fan and the fins.

19. The apparatus of claim 1, further including a chassis, the fan located closer to an outside of the chassis than the temperature sensing device is to the outside of the chassis.

20. The apparatus of claim 1, wherein the temperature sensing device is inside an area of overlap between the fan and the fins.

* * * * *